(12) United States Patent
Wasekura

(10) Patent No.: US 9,571,088 B2
(45) Date of Patent: Feb. 14, 2017

(54) SEMICONDUCTOR DEVICE

(71) Applicant: TOYOTA JIDOSHA KABUSHIKI KAISHA, Toyota-shi, Aichi (JP)

(72) Inventor: Masaki Wasekura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/916,074

(22) PCT Filed: Sep. 10, 2014

(86) PCT No.: PCT/JP2014/073958
§ 371 (c)(1),
(2) Date: Mar. 2, 2016

(87) PCT Pub. No.: WO2015/064222
PCT Pub. Date: May 7, 2015

(65) Prior Publication Data
US 2016/0233856 A1    Aug. 11, 2016

(30) Foreign Application Priority Data
Oct. 31, 2013   (JP) .................................. 2013-227679

(51) Int. Cl.
H03K 19/00     (2006.01)
H03K 17/16     (2006.01)
H03K 17/082    (2006.01)

(52) U.S. Cl.
CPC .......... H03K 17/16 (2013.01); H03K 17/0828 (2013.01); *H03K 2217/0027* (2013.01)

(58) Field of Classification Search
None
See application file for complete search history.

(56) References Cited

U.S. PATENT DOCUMENTS

| 6,057,728 A   | * | 5/2000  | Igarashi ............. H03K 17/0828 |
|               |   |         | 327/427                            |
| 2009/0057832 A1 |   | 3/2009 | Kouno                              |
| 2016/0231358 A1 | * | 8/2016 | Wasekura .......... H03K 17/0828   |
| 2016/0233788 A1 | * | 8/2016 | Osanai ................. H02M 1/08  |
| 2016/0269007 A1 | * | 9/2016 | Wasekura .......... H03K 17/0828   |

FOREIGN PATENT DOCUMENTS

| JP | 2008-072848 A | 3/2008  |
|----|---------------|---------|
| JP | 2009-268054 A | 11/2009 |
| JP | 4924578 B2    | 4/2012  |

\* cited by examiner

*Primary Examiner* — Long Nguyen
(74) *Attorney, Agent, or Firm* — Oliff PLC

(57) ABSTRACT

A semiconductor device includes a transistor; a diode configured to be connected in reverse-parallel with the transistor; a sense transistor configured to generate a sense current depending on a current flowing in the transistor; a sense diode configured to generate a sense diode current depending on a current flowing in the diode; a resistor part configured to have one terminal connected with an emitter of the sense transistor and an anode of the sense diode, and another terminal connected with an emitter of the transistor and an anode of the diode, and to have the sense current or the sense diode current flow in the resistor part; and a resistance value control unit configured to differentiate a resistance value of the resistor part for a case where the sense current flows in the resistor part, and for a case where the sense diode current flows in the resistor part.

12 Claims, 4 Drawing Sheets

SEMICONDUCTOR DEVICE

TECHNICAL FIELD

The disclosures herein generally relate to a semiconductor device.

BACKGROUND ART

Conventionally, a technology has been known that detects a current flowing in a transistor, and a current flowing in a diode that is connected in reverse-parallel with the transistor, by a common sense resistor (see, for example, Patent Document 1).

RELATED-ART DOCUMENTS

Patent Documents

[Patent Document 1] Japanese Laid-open Patent Publication No. 2009-268054

SUMMARY OF THE INVENTION

Problem to be Solved by Invention

However, when detecting a current flowing in a transistor, and a current flowing in a diode that is connected in reverse-parallel with the transistor, by a common sense resistor, it is difficult to independently adjust detection sensitivities for the respective currents, by using the sense resistor of a conventional technology.

Thereupon, it is an object of at least one embodiment to provide a semiconductor device that can independently adjust the detection sensitivity of a current flowing in a transistor, and the detection sensitivity of a current flowing in a diode that is connected in reverse-parallel with the transistor.

Means to Solve the Problem

According to at least one embodiment, a semiconductor device includes a transistor; a diode configured to be connected in reverse-parallel with the transistor; a sense transistor configured to generate a sense current depending on a current flowing in the transistor; a sense diode configured to generate a sense diode current depending on a current flowing in the diode; a resistor part configured to have one terminal connected with an emitter of the sense transistor and an anode of the sense diode, and another terminal connected with an emitter of the transistor and an anode of the diode, and to have the sense current or the sense diode current flow in the resistor part; and a resistance value control unit configured to differentiate a resistance value of the resistor part for a case where the sense current flows in the resistor part, and for a case where the sense diode current flows in the resistor part.

Advantage of the Invention

According to at least one embodiment, it is possible to independently adjust the detection sensitivity of a current flowing in a transistor, and the detection sensitivity of a current flowing in a diode that is connected in reverse-parallel with the transistor.

MODE FOR CARRYING OUT THE INVENTION

In the following, embodiments will be described with reference to the drawings.

Figure 1:
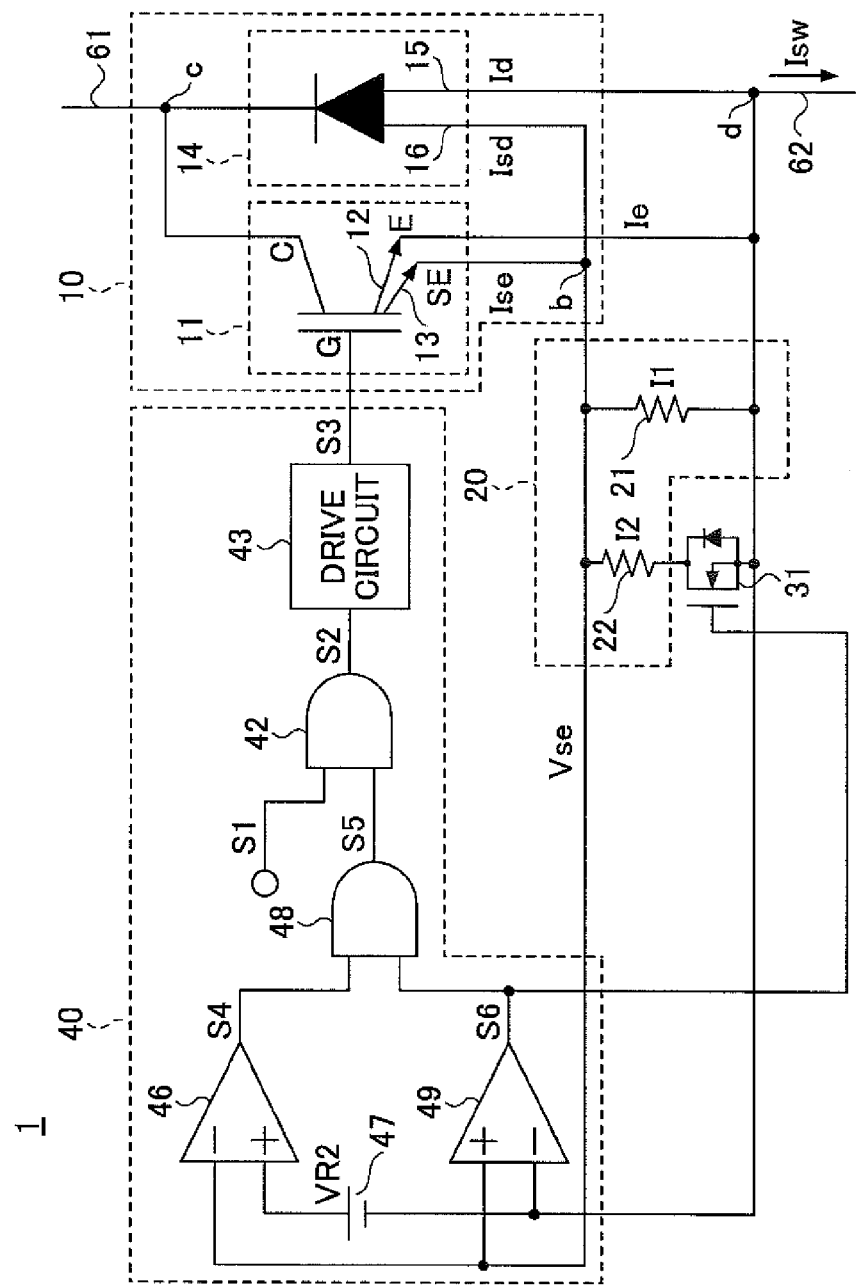
FIG. 1 is a configuration diagram of a semiconductor device according to an embodiment.

FIG. 1 is a diagram that illustrates a configuration example of a drive device 1 as an example of a semiconductor device. The drive device 1 may be a semiconductor device that has a configuration implemented by an integrated circuit, or a semiconductor device that has a configuration implemented by discrete parts.

The drive device 1 is a semiconductor circuit that includes a unit to drive an inductive load (for example, an inductor or a motor) connected with a first conductive part 61 or a second conductive part 62, by driving on and off a main transistor 12 of a transistor part 11. Devices that use one or more drive devices 1 include, for example, a converter that boosts or steps down DC power, an inverter that converts power between DC power and AC power, and the like.

For example, in a device that uses multiple drive devices 1, a switching circuit is disposed in which switching elements 10 are connected in series. The switching elements 10 are provided on a high side and on a low side with respect to an intermediate node with which an inductive load is connected. For example, a three-phase inverter that uses multiple drive devices 1 includes three of such switching circuits in parallel.

The conductive part 61 is a current path that is conductively connected with a high-power-potential part such as a positive electrode of a power source, or may be indirectly connected with the high-power-potential part via another switching element or a load. The conductive part 62 is a current path that is conductively connected with a low-power-potential part such as a negative electrode of a power source (for example, a ground potential part), or may be indirectly connected with the low-power-potential part via another switching element or a load.

The drive device 1 includes the switching element 10. The switching element 10 is an insulated-gate, voltage-controlled semiconductor element having a current sense function. The switching element 10 includes the transistor part 11 and a diode part 14.

For example, if the transistor part 11 is an insulated-gate bipolar transistor (IGBT), the switching element 10 is a diode-built-in IGBT that has the transistor part 11 and the diode part 14 disposed on a common semiconductor substrate. The diode-built-in IGBT has a structure that includes a common electrode for the anode electrode of the diode and the emitter electrode of the IGBT, and a common electrode for the cathode electrode of the diode and the collector electrode of the IGBT. The diode-built-in IGBT is also called the "reverse conducting IGBT (RC-IGBT)".

As a specific example of the transistor part 11, one may consider a power transistor element such as an IGBT and a metal-oxide semiconductor field-effect transistor (MOSFET). FIG. 1 illustrates an IGBT as an example of the transistor part 11. In the following description, it is assumed that the transistor part 11 is an IGBT for the sake of explanation. If it is a MOSFET, the wording may be changed to read a "collector" as a "drain", and an "emitter" as a "source".

The gate terminal G of the transistor part 11 is, for example, a control terminal connected with a drive circuit 43 of a control circuit 40 via a gate resistor connected in series with the gate terminal G. The collector terminal C of the transistor part 11 is a first main terminal connected with, for example, a connection point c, and connected with the conductive part 61 via the connection point c. The emitter terminal E of the transistor part 11 is a second main terminal connected with, for example, a connection point d, and connected with the conductive part 62 via the connection point d. The sense emitter terminal SE of the transistor part 11 is a sense terminal connected with, for example, a connection point b, and connected with one terminal of a resistor circuit 20 via the connection point b. The sense emitter terminal SE is connected with the conductive part 62 via the connection point d connected with another terminal of the resistor circuit 20.

The transistor part 11 is configured to include the main transistor 12 and a sense transistor 13. The main transistor 12 and the sense transistor 13 are switching elements such as IGBTs. The sense transistor 13 is connected in parallel with the main transistor 12. The main transistor 12 and the sense transistor 13 may be configured with multiple cell transistors, respectively.

Respective gate electrodes g of the main transistor 12 and the sense transistor 13 are control electrodes commonly connected with the gate terminal G of the transistor part 11. Respective collector electrodes c of the main transistor 12 and the sense transistor 13 are first main electrodes commonly connected with the collector terminal C of the transistor part 11. The emitter electrode e of the main transistor 12 is a second main electrode connected with the emitter terminal E of the transistor part 11. The sense emitter electrode se of the sense transistor 13 is the sense electrode connected with the sense emitter terminal SE of the transistor part 11.

The sense transistor 13 is an example of a sense transistor that generates a current depending on a current flowing in the main transistor 12, and is a sense element in which a greater current flows when a greater current flows in the main transistor 12. The sense transistor 13 outputs, for example, a sense current Ise that is proportional to a principal current Ie flowing in the main transistor 12.

For example, a collector current flowing from the collector terminal C into the transistor part 11 is divided into the principal current Ie flowing in the main transistor 12, and the sense current Ise flowing in the sense transistor 13, by a sense ratio n. The sense current Ise is a current that flows depending on the principal current Ie by the sense ratio n, and its current value is made smaller than the principal current Ie by the sense ratio n. The sense ratio n is determined, for example, depending on a ratio of the area of the emitter electrode e of the main transistor 12, and the area se of the sense emitter electrode se of the sense transistor 13.

The principal current Ie flows in the collector electrode c and the emitter electrode e of the main transistor 12, and is output from the emitter terminal E. The principal current Ie output from the emitter terminal E flows in the conductive part 62 via the connection point d. The sense current Ise flows in the collector electrode c and the sense emitter electrode se of the sense transistor 13, and is output from the sense emitter terminal SE. The sense current Ise output from the sense emitter terminal SE flows in the conductive part 62 via the resistor circuit 20 and the connection point d.

On the other hand, the diode part 14 is configured to include a main diode 15 and a sense diode 16.

The main diode 15 is an example of a diode connected in reverse-parallel with the main transistor 12, has the anode connected with the emitter terminal E, and the cathode connected with the collector terminal C. The anode electrode of the main diode 15 is a P-type electrode connected with the connection point d connected with the emitter terminal E, and connected with the conductive part 62 via the connection point d. The cathode electrode of the main diode 15 is an N-type electrode connected with the connection point c connected with the collector terminal C, and connected with the conductive part 61 via the connection point c.

The sense diode 16 is an example of a sense diode that generates a current depending on a current flowing in the main diode 15, and is a sense element in which a greater current flows when a greater current flows in the main diode 15. The sense diode 16 outputs, for example, a sense diode current Isd that is proportional to a diode current Id flowing in the main diode 15.

The sense diode current Isd is a current that flows depending on the diode current Id by a sense ratio m, and its current value is made smaller than the diode current Id by the sense ratio m.

The anode electrode of the sense diode 16 is a P-type electrode connected with the connection point b connected with the sense emitter terminal SE, and connected with the conductive part 62 via the resistor circuit 20 and the connection point d. The cathode electrode of the sense diode 16 is an N-type electrode connected with the connection point c connected with the collector terminal C, and connected with the conductive part 61 via the connection point c.

The drive device 1 has the resistor circuit 20 disposed between the sense emitter terminal SE and the emitter terminal E. The resistor circuit 20 is an example of a resistor part that has one terminal connected with the connection point b commonly connected with the sense emitter electrode se of the sense transistor 13 and the anode electrode of the sense diode 16, and another terminal connected with the connection point d commonly connected with the emitter electrode e of the main transistor 12 and the anode electrode of the main diode 15.

The resistor circuit 20 includes multiple sense resistors 21 and 22 connected in parallel. The sense resistor 21 is a first resistor element that has one terminal connected with the connection point b, and the other terminal connected with the connection point d. The sense resistor 22 is a second resistor element that has one terminal connected with the connection point b, and the other terminal connected with the connection point d via a transistor 31.

The drive device 1 includes a series circuit that has the sense resistor 22, and the transistor 31 connected in series with the sense resistor 22. The series circuit is connected in parallel with the sense resistor 21. The transistor 31 is an example of a resistance value control unit to change the resistance value of the resistor circuit 20, based on a detection result of a sense voltage Vse generated by the resistor circuit 20.

The sense voltage Vse is, for example, a voltage between both terminals of the resistor circuit 20, and is equivalent to a potential difference between the connection point b and the connection point d. The sense voltage Vse takes a negative voltage value when the sense diode current Isd flows in the resistor circuit 20 in the same direction as in the forward direction of the sense diode 16, and takes a positive voltage value when the sense current Ise flows in the resistor circuit 20 in a direction reverse to the forward direction of the sense diode 16. Also, the sense voltage Vse takes zero value when neither the sense diode current Isd nor the sense current Ise flows in the resistor circuit 20.

The resistance value of the resistor circuit 20 is equivalent to a combined resistance value Ra of the sense resistor 21 and the sense resistor 22. Note that the combined resistance value Ra may be a combined resistance value that also combines the on-resistance of the transistor 31.

The transistor 31 has a control electrode to input an output signal S6 output from a comparator 49, based on a detection result of the sense voltage Vse; a first main electrode connected with the connection point b via the sense resistor 22; and a second main electrode connected with the connection point d. Positions to place the sense resistor 22 and the transistor 31 may be exchanged with each other.

FIG. 1 illustrates a case where the transistor 31 is an n-channel MOSFET. In this case, the transistor 31 has the gate electrode to input the output signal S6, the drain electrode connected with the connection point b via the sense resistor 22, and the source electrode connected with the connection point d. Note that the transistor 31 may be any other switching element such as a bipolar transistor.

The transistor 31 is turned off when a low-level output signal S6 is output based on a detection result of a negative sense voltage Vse that is generated by the sense diode current Isd flowing in the resistor circuit 20. In other words, when the sense voltage Vse takes a negative value, the transistor 31 is turned off. When the transistor 31 is turned off, the combined resistance value Ra is equivalent to the resistance value of the sense resistor 21, and is greater than a resistance value taken when the transistor 31 is turned on.

On the other hand, the transistor 31 is turned on when a high-level output signal S6 is output based on a detection result of a positive sense voltage Vse that is generated by the sense current Ise flowing in the resistor circuit 20. In other words, when the sense voltage Vse takes a positive value, the transistor 31 is turned on. The reciprocal of the combined resistance value Ra when the transistor 31 is turned on is equivalent to the sum of the reciprocal of the resistance value of the sense resistor 21, and the reciprocal of the resistance value of the sense resistor 22. In other words, when the transistor 31 is turned on, the combined resistance value Ra is less than a resistance value taken when the transistor 31 is turned off.

In this way, the transistor 31 can change the combined resistance value Ra, based on a detection result of the sense voltage Vse. Therefore, even if the resistor circuit 20 is shared for detecting the principal current Ie and for detecting the diode current Id, the detection sensitivity of the principal current Ie, and the detection sensitivity of the diode current Id can be adjusted independently.

For example, the transistor 31 differentiates the combined resistance value Ra depending on whether the sense voltage Vse is a voltage generated by the sense current Ise flowing in the resistor circuit 20, or is a voltage generated by the sense diode current Isd flowing in the resistor circuit 20. Thus, the transistor 31 can set the combined resistance value Ra to different values when detecting the principal current Ie, and when detecting the diode current Id, respectively, so the detection sensitivity of the principal current Ie and the detection sensitivity of the diode current Id can be adjusted independently.

For example, assume that a voltage Vs1 represents the sense voltage Vse generated by the sense current Ise flowing in the resistor circuit 20, and a voltage Vs2 represents the sense voltage Vse generated by the sense diode current Isd flowing in the resistor circuit 20. For example, the voltage Vs1 takes a positive voltage value, and the voltage Vs2 takes a negative voltage value.

When the sense voltage Vse takes the voltage Vs2, the transistor 31 can raise the detection sensitivity of the sense diode current Isd by making the combined resistance value Ra be greater than a value taken when the sense voltage Vse takes the voltage Vs1. This makes it possible to detect a minute sense diode current Isd precisely, and to raise the detection sensitivity of the diode current Id. Therefore, it possible to detect that a diode current Id being a bit greater than zero flows in the main diode 15, with high precision by using the sense voltage Vse.

On the other hand, when the sense voltage Vse takes the voltage Vs1, the transistor 31 can lower the detection sensitivity of the sense current Ise by making the combined resistance value Ra be less than a value taken when the sense voltage Vse takes the voltage Vs2. This makes it possible to detect a comparatively great current (for example, an overcurrent) of the principal current Ie being greater than or equal to a predetermined value, by using the sense voltage Vse. Also, it is possible to prevent the sense voltage Vse from becoming excessively great, and to avoid a loss generated in the resistor circuit 20.

The drive device 1 includes the control circuit 40. The control circuit 40 is an example of a control unit to control driving the main transistor 12 and the sense transistor 13, based on a detection result of the sense voltage Vse.

When a negative sense voltage Vse is detected that is generated by the sense diode current Isd flowing in the resistor circuit 20, the control circuit 40 has the main transistor 12 and the sense transistor 13 turn off. Thus, when the diode current Id flows, the main transistor 12 and the sense transistor 13 can be prevented from being turned on. Also, when the diode current Id flows, the loss in the diode part 14 can be prevented from increasing, which could happen if the main transistor 12 and the sense transistor 13 were turned on.

For example, the control circuit 40 has the main transistor 12 and the sense transistor 13 turn off, when the sense voltage Vse is detected to be less than or equal to a predetermined threshold (for example, zero or a predetermined negative voltage value).

The control circuit 40 includes the comparator 49, a comparator 46, an AND circuit 42, and a drive circuit 43.

The comparator 49 is an example of a determination circuit that determines whether the sense current Ise flows in the resistor circuit 20 or the sense diode current Isd flows in the resistor circuit 20. The comparator 49 can detect that the sense diode current Isd stops flowing or the sense current Ise starts flowing, and can detect that the sense current Ise stops flowing or the sense diode current Isd starts flowing.

The comparator 49 inverts the voltage level of the output signal S6 at a timing when detecting that the sense voltage Vse goes over a predetermined threshold Vth. For example, the comparator 49 includes a non-inverted input part connected with the connection point b, and an inverted input part connected with the connection point d. In this case, the threshold Vth is set to zero.

The output signal S6 of the comparator 49 is input into an AND circuit 48 and the transistor 31.

When the diode current Id flows, the sense diode current Isd also flows, and hence, the sense voltage Vse is a negative voltage. When detecting that the sense voltage Vse changes from a negative value to zero or a greater value (namely, zero or a positive value), the comparator 49 switches the output signal S6 from the low level to the high level.

Switching the output signal S6 from the low level to the high level makes the transistor 31 turn on. Having the transistor 31 turned on, the combined resistance value Ra becomes less. When the transistor 31 is turned on, the sense current Ise flows in the transistor 31, the sense resistor 22 and the sense resistor 21.

On the other hand, when the principal current Ie flows, the sense current Ise also flows, and hence, the sense voltage Vse is a positive voltage. When detecting that the sense voltage Vse changes from a positive value to zero or a lesser value (namely, zero or a negative value), the comparator 49 switches the output signal S6 from the high level to the low level.

Switching the output signal S6 from the high level to the low level makes the transistor 31 turn off. Having the transistor 31 turned off, the combined resistance value Ra becomes greater. When the transistor 31 is turned off, the sense diode current Isd does not flow in the transistor 31 and the sense resistor 22, but flows in the sense resistor 21.

The comparator 46 is an example of an excessive current detection circuit that turns off the main transistor 12 and the sense transistor 13, based on the sense voltage Vse generated by the sense current Ise flowing in the resistor circuit 20. The comparator 46 includes an inverted input part connected with one terminal the resistor circuit 20, and a non-inverted input part connected with a reference voltage part 47 that outputs a constant reference voltage VR2. The reference voltage VR2 is a threshold voltage to determine whether the principal current Ie is an overcurrent.

When the diode current Id flows, the comparator 46 outputs a high-level output signal S4 because the sense voltage Vse is lower than the reference voltage VR2. Also, when a normal principal current Ie less than an overcurrent flows in the main transistor 12, the comparator 46 outputs a high-level output signal S4 because the sense voltage Vse is lower than the reference voltage VR2. Also, when an excessive principal current Ie greater than or equal to a predetermined value flows in the main transistor 12, the comparator 46 outputs a low-level output signal S4 because the sense voltage Vse is greater than the reference voltage VR2.

The control circuit 40 includes the AND circuit 48 that takes, as input, the output signal S6 of the comparator 49 and the output signal S4 of the comparator 46. The AND circuit 48 is an example of a determination unit that determines whether to turn on or off the main transistor 12 and the sense transistor 13, based on the voltage level of the output signal S4 and the voltage level of the output signal S6. The AND circuit 48 calculates the logical AND of the output signal S4 and the output signal S6, and outputs an output signal S5.

The AND circuit 42 is an example of a determination unit that determines whether to turn on or off the main transistor 12 and the sense transistor 13, based on the voltage level of the command signal S1 and the voltage level of the output signal S5. The AND circuit 42 calculates the logical AND of the command signal S1 and the output signal S5, and outputs a pre-drive signal S2. The command signal S1 is a signal commanding to turn on or off the main transistor 12 and the sense transistor 13, and is a signal supplied from an external device such as a microcomputer (for example, a pulse-width modulation signal).

The AND circuit 42 outputs a low-level pre-drive signal S2 if at least one of the command signal S1 and the output signal S5 is a low-level signal commanding to turn off the main transistor 12 and the sense transistor 13. The low-level pre-drive signal S2 is a signal to turn off the main transistor 12 and the sense transistor 13. In other words, the AND circuit 42 outputs a low-level pre-drive signal S2 if the output signal S5 takes the low level even if receiving a high-level command signal S1 commanding to turn on the main transistor 12 and the sense transistor 13.

On the other hand, the AND circuit 42 outputs a high-level pre-drive signal S2 if both the command signal S1 and the output signal S5 are high-level signals commanding to turn on the main transistor 12 and the sense transistor 13. A high-level pre-drive signal S2 is a signal to turn on the main transistor 12 and the sense transistor 13.

The drive circuit 43 outputs a gate drive signal S3 having the same phase as the pre-drive signal S2 output from the AND circuit 42. The drive circuit 43 shifts the voltage level of the pre-drive signal S2 high enough to drive the main transistor 12 and the sense transistor 13, and outputs the gate drive signal S3 whose voltage level is greater than the voltage level of the pre-drive signal S2.

Thus, the control circuit 40 can turn off the main transistor 12 and the sense transistor 13 when detecting at least one of the diode current Id flowing in the main diode 15, and an excessive principal current Ie flowing in the main transistor 12. On the other hand, if detecting a normal principal current Ie flowing in the main transistor 12, the control circuit 40 can turn on the main transistor 12 and the sense transistor 13.

Figure 2:
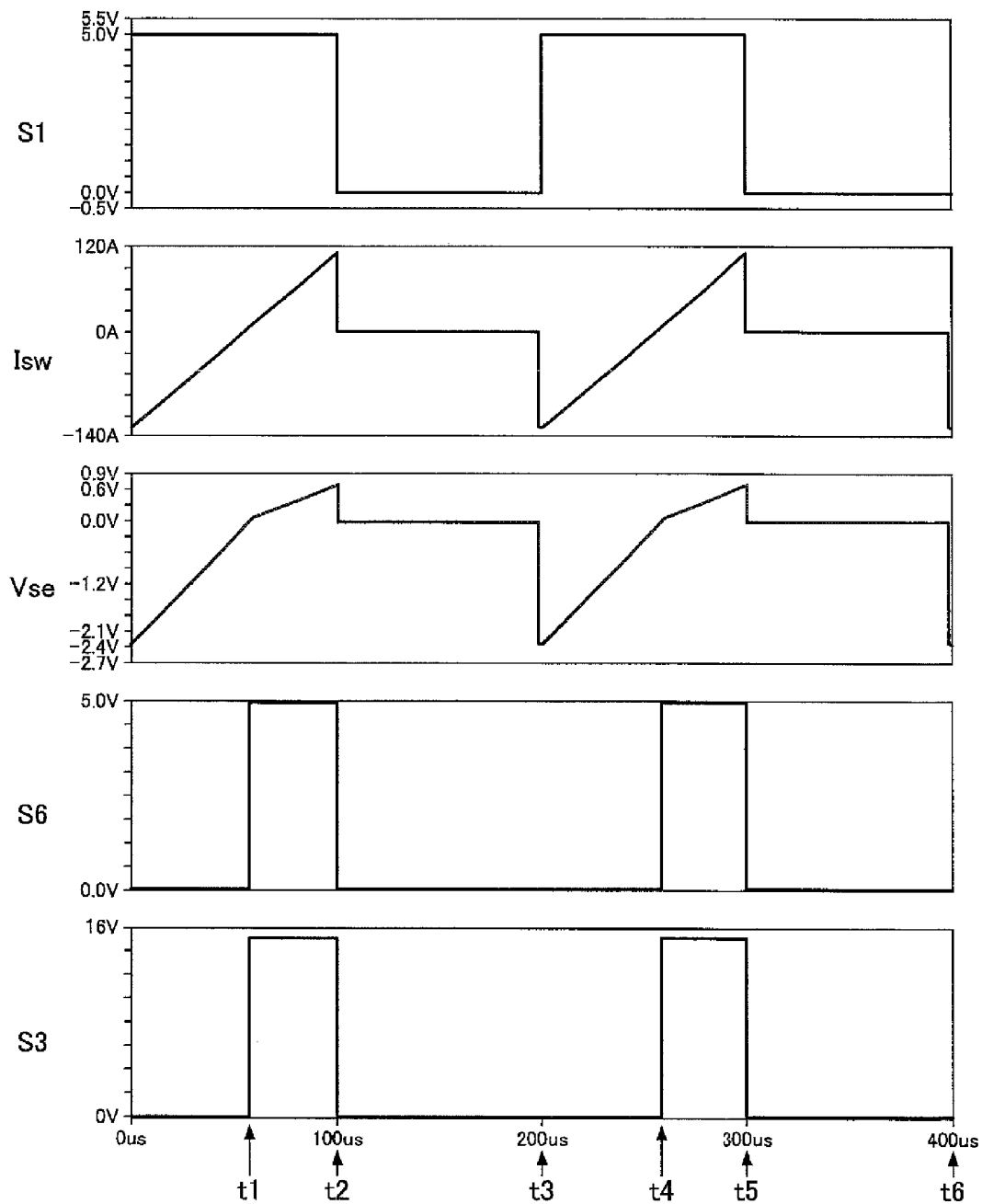
FIG. 2 is a timing chart illustrating an example of operational waveforms of a semiconductor device.

FIG. 2 is a timing chart that illustrates an example of operational waveforms of the drive device 1. The command signal S1 is a signal commanding to have the main transistor 12 and the sense transistor 13 turn on or off. A current Isw is a current flowing in the conductive part 62, and virtually equivalent to the sum of the principal current Ie and the diode current Id. Note that since the sense current Ise is sufficiently less than the principal current Ie, and the sense diode current Isd is sufficiently less than the diode current Id, the magnitude of the sense current Ise and the sense diode current Isd is negligible with respect to the current Isw.

A period during which the current Isw takes a negative value, represents that the current Isw flows in the same direction as in the forward direction of the main diode 15 and the sense diode 16. The forward direction of the main diode 15 and the sense diode 16 is a direction from the anode electrode to the cathode electrode. On the other hand, a period during which the current Isw takes a positive value, represents that the current Isw flows in a direction reverse to the forward direction of the main diode 15 and the sense diode 16. The direction reverse to the forward direction of the main diode 15 and the sense diode 16 is a direction from the collector terminal C to the emitter terminal E or the sense emitter terminal SE.

When the diode current Id flows, the sense diode current Isd also flows, and hence, the sense voltage Vse is a low-level negative voltage. When the sense voltage Vse is a low-level negative voltage, the output signal S6 takes the low level. Therefore, if the command signal S1 takes the high level, and the output signal S6 takes the low level, then, the gate drive signal S3 takes the low level, and hence, both the main transistor 12 and the sense transistor 13 are turned off. By having the main transistor 12 and the sense transistor 13 turned off, the flow of the principal current Ie and the sense current Ise is cut off. When the output signal S6 takes the low level, the transistor 31 is turned off. Therefore, when the flow of the principal current Ie and the sense current Ise is cut off, the current Isw is virtually equivalent to the sum of the diode current Id and a resistor current I1 flowing in the sense resistor 21.

While the diode current Id decreases, the sense diode current Isd also decreases. The sense diode current Isd is virtually equivalent to the resistor current I1. When the diode current Id decreases to zero amperes, the current Isw also decreases to virtually zero amperes. Around zero amperes where the current Isw switches from negative to positive, the output signal S6 switches from the low level to the high level (see timings t1 and t4). Thus, the gate drive signal S3 takes the high level.

Therefore, when the command signal S1 takes the high level and the output signal S6 takes the high level, then, the gate drive signal S3 takes the high level, and both the main transistor 12 and the sense transistor 13 are turned on. By having both the main transistor 12 and the sense transistor 13 turned on, the principal current Ie and the sense current Ise increase gradually, and hence, the current Isw also increases gradually (see period t1-t2 and period t4-t5).

At timing t1 or t4 when the sense diode current Isd stops flowing or the sense current Ise starts flowing, the combined resistance value Ra becomes less by the transistor 31 than in a period during which the sense diode current Isd flows. This makes the rising slope of the sense voltage Vse gentle (see period t1-t2 and period t4-t5).

When the command signal S1 switches from the high level to the low level, the gate drive signal S3 switches from the high level to the low level (see timings t2 and t5), and hence, both the main transistor 12 and the sense transistor 13 are turned off. By having both the main transistor 12 and the sense transistor 13 turned off, the flow of the principal current Ie and the sense current Ise is cut off (see period t2-t3).

While the principal current Ie decreases, the sense current Ise also decreases. The sense current Ise is virtually equivalent to the sum of the resistor current I1 and a resistor current I2. The resistor current I2 is a current flowing in the sense resistor 22. When the principal current Ie decreases to zero amperes, the current Isw also decreases to virtually zero amperes. Around zero amperes where the current Isw switches from positive to negative, the output signal S6 switches from the high level to the low level (see timings t2 and t5). Thus, the gate drive signal S3 takes the low level.

At timing t2 or t5 when the sense current Ise stops flowing, the combined resistance value Ra becomes greater by the transistor 31 than in a period during which the sense current Ise flows. Note that at timing t3 or t6 when the sense diode current Isd starts flowing, the combined resistance value Ra may become greater by the transistor 31 than in a period during which the sense current Ise flows.

Figure 3:
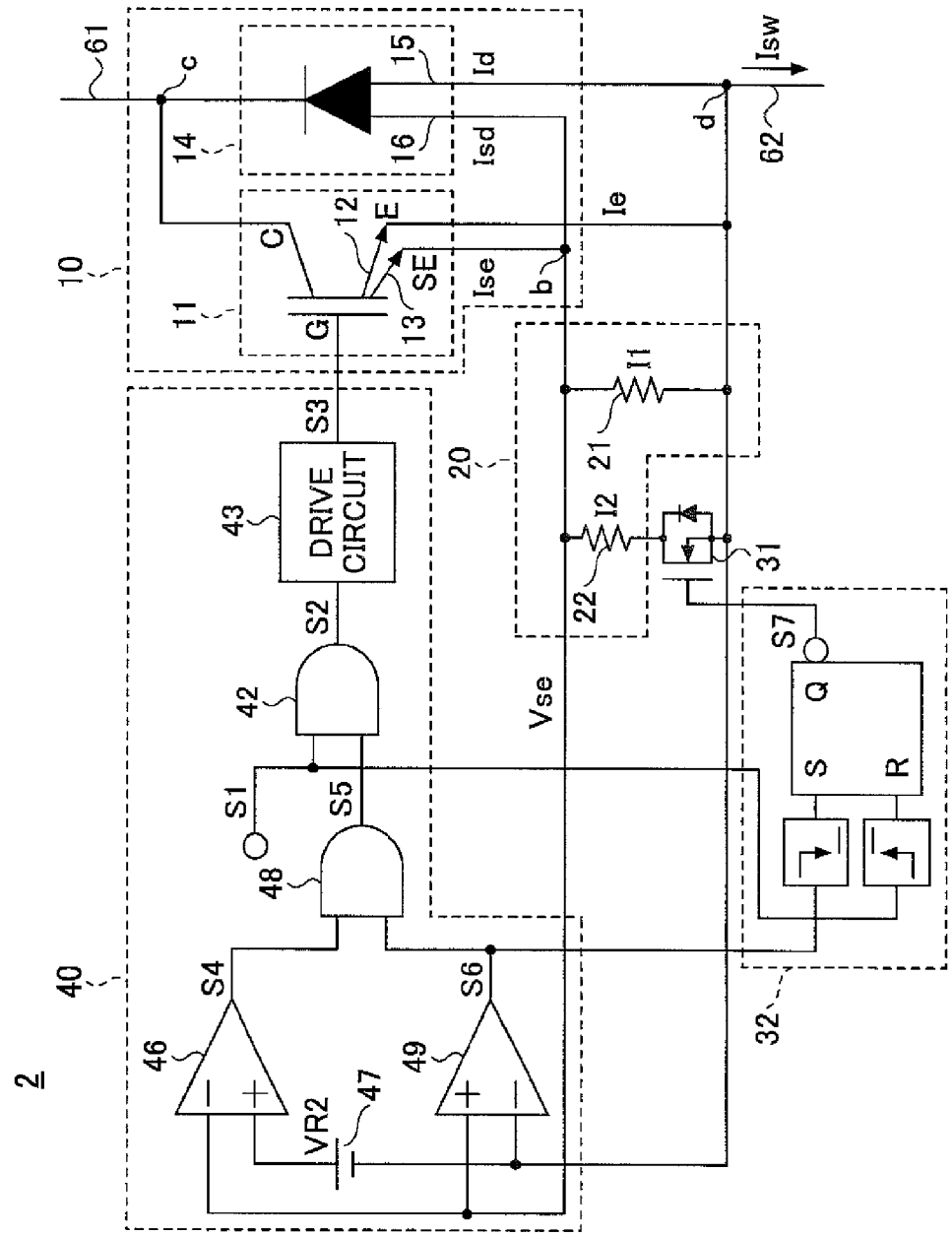
FIG. 3 is a configuration diagram of a semiconductor device according to an embodiment.

FIG. 3 is a diagram that illustrates a configuration example of a drive device 2 as an example of a semiconductor device. Description is omitted here for the same elements and effects as in the configuration example of the drive device described above. The drive device 2 includes an RS flip-flop 32. The RS flip-flop 32 has a transistor 31 switch from on to off at a rising edge of a command signal S1, and has the transistor 31 switch from off to on at a timing when a sense voltage Vse goes over a threshold. In the case of FIG. 2, the rising edge of the command signal S1 corresponds to timing t2 or t5, and the timing when the sense voltage Vse goes over the threshold corresponds to timing t1 or t4.

Since the RS flip-flop 32 can remove chattering of an output signal S6 of a comparator 49, on and off operations of the transistor 31 can be stabilized.

Figure 4:
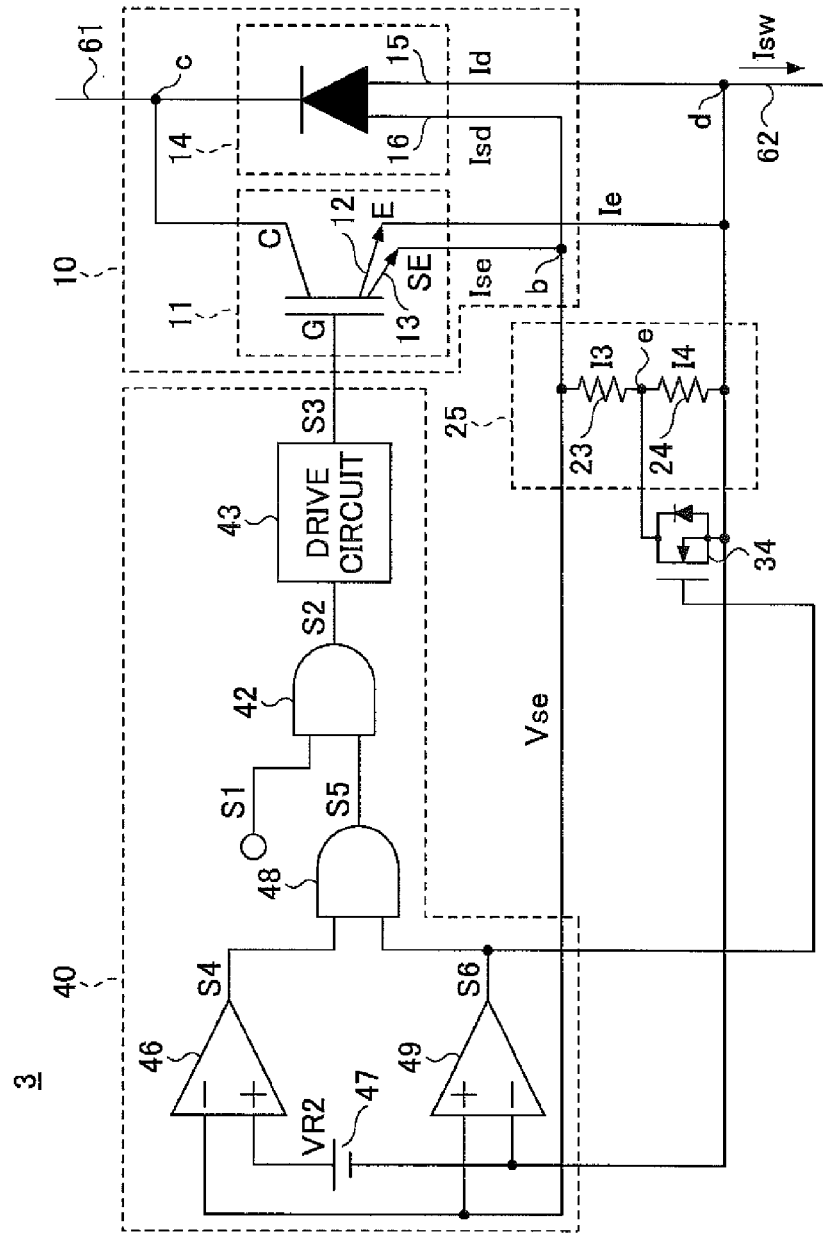
FIG. 4 is a configuration diagram of a semiconductor device according to an embodiment.

FIG. 4 is a diagram that illustrates a configuration example of a drive device 3 as an example of a semiconductor device. Description is omitted here for the same elements and effects as in the configuration example of the drive device described above. The drive device 3 includes a resistor circuit 25 disposed between a sense emitter terminal SE and an emitter terminal E. The resistor circuit 25 is an example of a resistor part that has one terminal connected with a connection point b commonly connected with the sense emitter electrode se of a sense transistor 13 and the anode electrode of a sense diode 16, and another terminal connected with a connection point d commonly connected with the emitter electrode e of a main transistor 12 and the anode electrode of a main diode 15.

The resistor circuit 25 includes multiple sense resistors 23 and 24 connected in series. The sense resistor 23 is a first resistor element that has one terminal connected with the connection point b, and the other terminal connected with a connection point e. The sense resistor 24 is a second resistor element that has one terminal connected with the connection point e, and the other terminal connected with the connection point d.

The drive device 3 includes a parallel circuit that has the sense resistor 24, and a transistor 34 connected in parallel with the sense resistor 24. The parallel circuit is connected in series with the sense resistor 23. The transistor 34 is an example of a resistance value control unit to change the resistance value of the resistor circuit 25, based on a detection result of a sense voltage Vse generated by the resistor circuit 25.

The resistance value of the resistor circuit 25 is equivalent to a combined resistance value Rb of the sense resistor 23 and the sense resistor 24. Note that the combined resistance value Rb may be a combined resistance value that also combines the on-resistance of the transistor 34.

The transistor 34 has a control electrode to input an output signal S6 output from a comparator 49, based on a detection result of the sense voltage Vse; a first main electrode connected with the connection point b via the sense resistor 23; and a second main electrode connected with the connection point d. The transistor 34 may be connected in parallel with the sense resistor 23.

FIG. 4 illustrates a case where the transistor 34 is an n-channel MOSFET. In this case, the transistor 34 has the gate electrode to input the output signal S6, the drain electrode connected with the connection point b via the sense resistor 23, and the source electrode connected with the connection point d. Note that the transistor 34 may be any other switching element such as a bipolar transistor.

The transistor 34 is turned off when a low-level output signal S6 is output based on a detection result of a negative sense voltage Vse that is generated by the sense diode current Isd flowing in the resistor circuit 25. In other words, when the sense voltage Vse takes a negative value, the transistor 34 is turned off. When the transistor 34 is turned off, the combined resistance value Rb is equivalent to the sum of the resistance value of the sense resistor 23 and the resistance value of the sense resistor 24, and is greater than a resistance value taken when the transistor 34 is turned on.

On the other hand, the transistor 34 is turned on when a high-level output signal S6 is output based on a detection result of a positive sense voltage Vse that is generated by the sense current Ise flowing in the resistor circuit 20. In other words, when the sense voltage Vse takes a positive value, the transistor 34 is turned on. The combined resistance value Rb when the transistor 34 is turned on is equivalent to the resistance value of the sense resistor 23, and is less than a resistance value taken when the transistor 34 is turned off.

In this way, the transistor 34 can change the combined resistance value Rb, based on a detection result of the sense voltage Vse. Therefore, even if the resistor circuit 25 is shared for detecting the principal current Ie and for detecting the diode current Id, the detection sensitivity of the principal current Ie, and the detection sensitivity of the diode current Id can be adjusted independently.

The semiconductor device has been described with the embodiments as above. Note that the present invention is not limited to the above embodiments. Various modifications and improvements can be made within the scope of the present invention, by combining and/or replacing a part of or all of the embodiments with the others.

For example, a switching element such as a transistor may be a switching element other than an IGBT, for example, an N-channel MOSFET or a P-channel MOSFET.

Also, for example, the number of sense resistors is not limited to two, but may be three or more. The sense resistor may be a variable resistor whose resistance value can be changed.

The present application is based on Japanese Priority Application No. 2013-227679, filed on Oct. 31, 2013, the entire contents of which are hereby incorporated by reference.

DESCRIPTION OF REFERENCE SYMBOLS 1, 2, 3 drive device (example of semiconductor device)
10 switching element
11 transistor part
12 main transistor
13 sense transistor
14 diode part
15 main diode
16 sense diode
20, 25 resistor circuit (example of resistor part)
21, 22, 23, 24 sense resistor
31, 34 transistor (example of resistance value control unit)
32 RS flip-flop circuit (example of resistance value control unit)
40 control circuit
47 reference voltage part
61, 62 conductive part

The invention claimed is:

1. A semiconductor device, comprising:
a transistor;
a diode configured to be connected in reverse-parallel with the transistor
a sense transistor configured to generate a sense current depending on a current flowing in the transistor;
a sense diode configured to generate a sense diode current depending on a current flowing in the diode;
a resistor part configured to have one terminal connected with an emitter of the sense transistor and an anode of the sense diode, and another terminal connected with an emitter of the transistor and an anode of the diode, and to have the sense current or the sense diode current flow in the resistor part; and
a resistance value control unit configured to differentiate a resistance value of the resistor part for a case where the sense current flows in the resistor part, and for a case where the sense diode current flows in the resistor part.

2. The semiconductor device as claimed in claim 1, wherein the resistance value control unit changes the resistance value when detecting that the sense diode current stops flowing, or when detecting that the sense current starts flowing.

3. The semiconductor device as claimed in claim 1, wherein the resistance value control unit changes the resistance value when detecting that the sense current stops flowing, or when detecting that the sense diode current starts flowing.

4. The semiconductor device as claimed in claim 1, wherein the resistance value is greater for the case where the sense diode current flows in the resistor part, than for the case where the sense current flows in the resistor part.

5. The semiconductor device as claimed in claim 1, wherein the resistor part includes a plurality of resistors,
wherein the resistance value control unit changes a combined resistance value of the resistors.

6. The semiconductor device as claimed in claim 1, wherein the resistance value control unit changes the resistance value, based on a detection result of a sense voltage generated by the resistor part.

7. The semiconductor device as claimed in claim 6, wherein the resistance value control unit changes the resistance value when detecting that the sense voltage goes over a threshold.

8. The semiconductor device as claimed in claim 6, wherein the resistance value control unit changes the resistance value when detecting that the sense voltage changes from a negative value to a value greater than or equal to zero, or when detecting that the sense voltage changes from a positive value to a value less than or equal to zero.

9. The semiconductor device as claimed in claim 6, further comprising:
a control unit configured to control driving the transistor, based on the detection result of the sense voltage.

10. The semiconductor device as claimed in claim 9, wherein the control unit turns off the transistor when the current flows in the diode.

11. The semiconductor device as claimed in claim 10, wherein the control unit turns off the transistor when the current flows in the diode even when receiving a command to turn on the transistor.

12. The semiconductor device as claimed in claim 9, wherein the control unit turns off the transistor when detecting at least one of the current flowing in the diode, and the current greater than or equal to a predetermined value flowing in the transistor.

* * * * *